US010132903B2

(12) United States Patent
Wheaton

(10) Patent No.: US 10,132,903 B2
(45) Date of Patent: Nov. 20, 2018

(54) MAGNETIC RESONANCE IMAGING METHOD, MAGNETIC RESONANCE IMAGING APPARATUS AND MAGNETIC RESONANCE IMAGING SYSTEM

(71) Applicant: TOSHIBA MEDICAL SYSTEMS CORPORATION, Otawara-Shi (JP)

(72) Inventor: Andrew J Wheaton, Shaker Heights, OH (US)

(73) Assignee: TOSHIBA MEDICAL SYSTEMS CORPORATION, Otawara-shi (JP)

( * ) Notice: Subject to any disclaimer, the term of this patent is extended or adjusted under 35 U.S.C. 154(b) by 670 days.

(21) Appl. No.: 14/554,827

(22) Filed: Nov. 26, 2014

(65) Prior Publication Data

US 2016/0146916 A1    May 26, 2016

(51) Int. Cl.
*G01R 33/565* (2006.01)
*G01R 33/483* (2006.01)

(52) U.S. Cl.
CPC .... *G01R 33/56536* (2013.01); *G01R 33/4833* (2013.01)

(58) Field of Classification Search
CPC .......... G01R 33/4833; G01R 33/56536; G01R 33/4835; G01R 33/54; G01R 33/543
USPC ................................ 324/307, 309
See application file for complete search history.

(56) References Cited

U.S. PATENT DOCUMENTS

| 5,757,188 | A | 5/1998 | Miyazaki | |
|---|---|---|---|---|
| 7,071,690 | B2 | 7/2006 | Butts et al. | |
| 7,821,264 | B2 | 10/2010 | Koch et al. | |
| 7,928,729 | B2 | 4/2011 | Hargreaves et al. | |
| 7,952,356 | B2 | 5/2011 | Koch et al. | |
| 2011/0267053 | A1* | 11/2011 | Li | G01R 33/4833 324/309 |
| 2014/0028313 | A1* | 1/2014 | Paul | G01R 33/5617 324/309 |
| 2015/0309139 | A1* | 10/2015 | Bachschmidt | G01R 33/341 324/309 |

OTHER PUBLICATIONS

Koch, K. M., et al. "Multiple resonant frequency offset acquisitions for imaging of metallic implants." Proceedings of the 16th Annual Meeting of ISMRM. 2008.*

(Continued)

*Primary Examiner* — Rishi Patel
(74) *Attorney, Agent, or Firm* — Oblon, McClelland, Maier & Neustadt, L.L.P.

(57) ABSTRACT

In one embodiment a magnetic resonance imaging method is disclosed. The method includes the steps of selecting a first RF pulse, selecting a second RF pulse, selecting one of the first RF pulse and the second RF pulse to be spatially selective, with the other being non-spatially selective, selecting a frequency of the first RF pulse to be the same or different than a frequency of the second RF pulse, applying the first RF pulse to excite a first portion of an object, applying the second RF pulse, forming at least one echo in the first portion of the object, obtaining signal data from the first portion of the object in response to the first RF pulse and the second RF pulse and reconstructing the obtained signal data from the first portion to form an image.

9 Claims, 7 Drawing Sheets

(56) References Cited

OTHER PUBLICATIONS

Artz N.S. et al., "Spectrally Resolved Fully Phase-Encoded Three-Dimensional Fast Spin-Echo Imaging", Magnetic Resonance in Medicine 71(2):681-690 (2014).
Butts K. et al., "Reduction of Blurring in View Angle Tilting MRI", Magnetic Resonance in Medicine 53:418-424 (2005).
Cho Z.H. et al., "Total Inhomogeneity Correction Including Chemical Shifts and Susceptibility by View Angle Tilting", Medical Physics 15(1):7-11 (Jan./Feb. 1988).
Koch K.M. et al. "Imaging Near Metal With a MAVRIC-SEMAC Hybrid", Magnetic Resonance in Medicine 65:71-82 (2011).
Koch K.M. et al., "A Multispectral Three-Dimensional Acquisition Technique for Imaging Near Metal Implants", Magnetic Resonance in Medicine 61:381-390 (2009).
Lu W. et al., "SEMAC: Slice Encoding for Metal Artifact Correction in MRI", Magnetic Resonance in Medicine 62:66-76 (2009).
Olsen R.V. et al., "Metal Artifact Reduction Sequence: Early Clinical Applications", RadioGraphics 20:699-712 (2000).

\* cited by examiner

MAGNETIC RESONANCE IMAGING METHOD, MAGNETIC RESONANCE IMAGING APPARATUS AND MAGNETIC RESONANCE IMAGING SYSTEM

FIELD

Embodiments described herein relate generally to an MRI (magnetic resonance imaging) apparatus, MRI methods and MRI systems.

BACKGROUND

Magnetic resonance imaging (MRI) is an imaging scan method that magnetically excites nuclear spins of a subject placed in a magnetostatic field by a radio frequency (RF) pulse having a Larmor frequency thereof, to generate an image from magnetic resonance signal data generated with the excitation.

Several patients that are candidates for MRI have varying metal elements implanted within their bodies. These metal elements can be of many different types, including staples and other surgical implements, dental elements such as crowns and fillings, fixation devices such as plates, screws and pins, artificial joints, including hip implants and artificial knees, and pacemakers and other implantable electrical devices. Typically a metal artifact consists of an area of zero signal in an MRI, often with a high intensity rim on one or two edges, with neighboring regions showing a marked distortion. These distortion and signal problems are due to most metals having higher susceptibilities to magnetization than the body tissues they are surrounded by, thereby creating large magnetic field inhomogeneities around the metal object.

Typical methods for adjusting for metal elements can increase scan times or not resolve the signal and distortion issues caused by that metal elements.

An object of the present disclosure is to provide a magnetic resonance imaging apparatus and a magnetic resonance imaging method that can scan a region of a patient that includes a metal element with less distortion.

BRIEF DESCRIPTION OF THE DRAWINGS

The present disclosure will be better understood by reference to the following drawings of which.

DETAILED DESCRIPTION

In one exemplary embodiment, a magnetic resonance imaging method is disclosed. The method includes the steps of selecting a first RF pulse, selecting a second RF pulse, selecting one of the first RF pulse and the second RF pulse to be spatially selective, with the other being non-spatially selective, selecting the frequency of the first RF pulse to be the same or different than the frequency of the second RF pulse, applying the first RF pulse to excite a first portion of an object, applying the second RF pulse, forming at least one echo in the first portion of the object, obtaining signal data from the first portion of the object in response to the first RF pulse and the second RF pulse and reconstructing the obtained signal data from the first portion to form an image.

Figure 1:
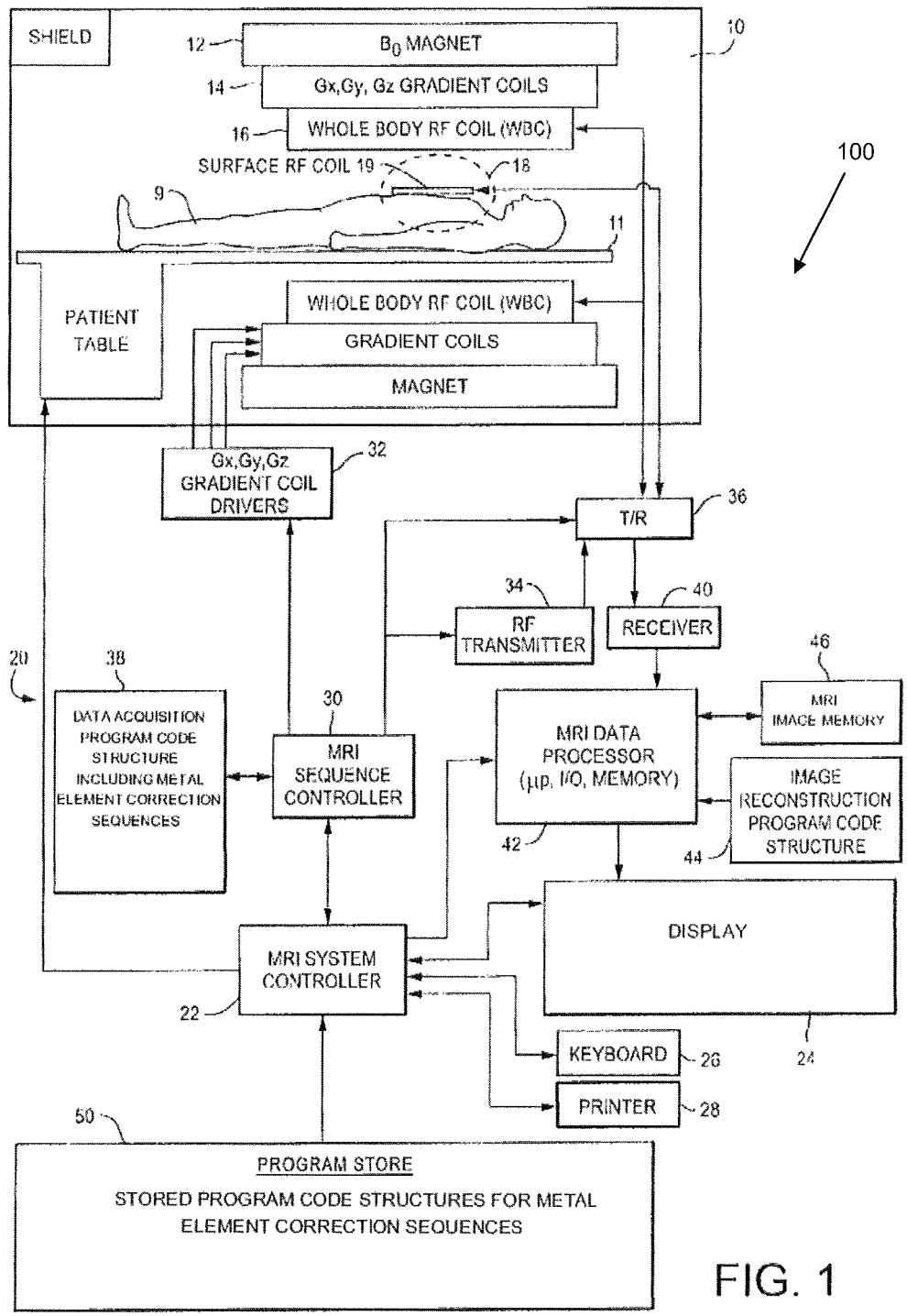
FIG. 1 is a schematic block diagram of an exemplary MRI system configured to perform metal element correction.

FIG. 1 is a block diagram illustrating a magnetic resonance imaging (MRI) apparatus 100 according to the first embodiment of the present disclosure.

The MRI apparatus 100 shown in FIG. 1 includes a gantry 10 (shown in schematic cross section) and various related system components 20 interfaced therewith. At least the gantry 10 is typically located in a shielded room. One MRI system geometry depicted in FIG. 1 includes a substantially coaxial cylindrical arrangement of the static field $B_0$ magnet 12, a Gx, Gy and Gz gradient coil set 14 and a large whole body RF coil (WBC) assembly 16. Along the horizontal axis of the cylindrical array of elements is an imaging volume 18 shown as substantially encompassing the chest of a patient 9 supported by a patient table 11. A smaller RF coil 19 is shown as more closely coupled to the chest of the patient 9 in image volume 18. RF coil 19 can be a surface coil or array or the like and can be customized or shaped for particular body parts, such as skulls, arms, shoulders, elbows, wrists, knees, legs, chests, spines, etc. An MRI system controller 22 interfaces with MRI sequence controller 30, which, in turn controls the Gx, Gy and Gz gradient coil drivers 32, as well as the RF transmitter 34 and the transmit/receive switch 36 (if the same RF coil is used for both transmission and reception). The MRI sequence controller 30 includes suitable program code structure 38 for implementing data acquisition sequences in the presence of metal elements, which later can be employed in conjunction with other (e.g. conventional or known diagnostic) MRI sequences. The MRI system controller 22 also can optionally interface with a printer 28, a keyboard 26 and a display 24.

The various related system components 20 includes an RF receiver 40 providing input to data processor 42, which is configured to create processed image data, which is then sent to display 24. The MRI data processor 42 is also configured for access to previously acquired data acquisitions in the presence of metal elements stored in MRI image memory 46, and to correct/compensate MR image data such as program code structure 50, as well as MRI image reconstruction program code structure 44.

Also illustrated in FIG. 1 is a generalized depiction of an MRI system program store 50 where stored program code structures (e.g., for defining graphical user interfaces and accepting operator inputs to the graphical user interface, etc.) are stored in non-transitory computer-readable storage media accessible to the various data processing components of the MRI system. The program store 50 may be segmented and directly connected, at least in part, to different elements of the various related system components 20 as needed.

FIG. 1 depicts a simplified diagram of an MRI system with some modifications so as to practice exemplary embodiments described herein. The system components can be divided into different collections of "boxes" and can include numerous digital signal processors, microprocessors and special purpose processing circuits that are capable of performing, for example, fast analog/digital conversions, Fourier transforms and array processing. Each of these processors can be a clocked "state machine" wherein the physical data processing circuits progress from one physical state to another upon the occurrence of each clock cycle (or predetermined number of clock cycles.)

Not only can the physical state of processing circuits (e.g., CPU's, registers, buffers, arithmetic units, etc.) progressively change from one clock cycle to another during the course of operation, the physical state of associated data storage media (e.g., bit storage sites in magnetic storage media) is transformed from one state to another during operation of such a system. For example, at the conclusion of a metal element corrected imaging reconstruction process, an array of computer-readable accessible data value storage sites in physical storage media will be transformed from some prior state (e.g., all uniform "zero values of all "one" values) to a new state wherein the physical states at the physical sites of such an array vary between minimum and maximum values to represent real world physical events and conditions (e.g., the internal physical structures of a patient over an imaged volume space). Such arrays of stored data values represent and also constitute a physical structure—as does a particular structure of computer control program codes that, when sequentially loaded into instruction registers and executed by one or more CPUs of the various related system components 20, causes a particular sequence of operational states to occur and be transitioned through within the MRI system.

The embodiments described below provide improved ways to process data acquisitions and to generate and display MR images.

Figure 2:
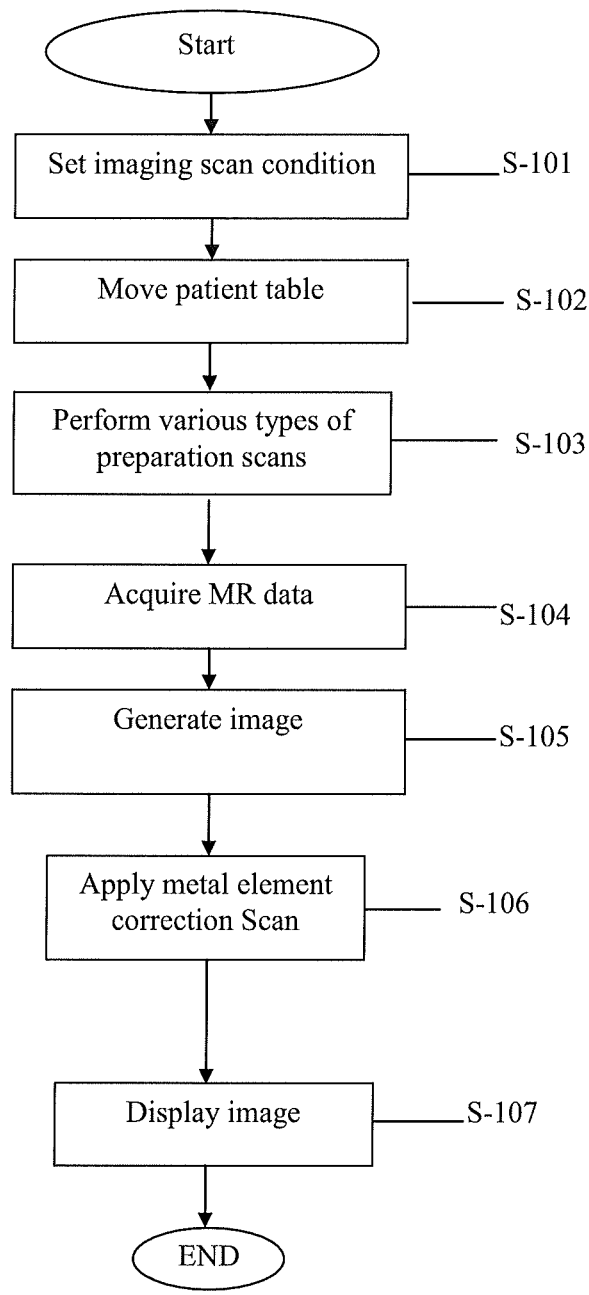
FIG. 2 is an flowchart of a process in an exemplary embodiment.

FIG. 2 is a flowchart of a process of a first embodiment. First, the MRI sequence controller 30 receives an input through MRI system controller 22 from an operator, providing image scan conditions and a position of an object or a patient's body to be scanned (S-101). The MRI sequence controller 30 then causes patient table 11 to move into the appropriate position based on the area to be scanned (S-102).

Then, MRI sequence controller 30 can perform various types of preparation scans (S-103). For example, the preparation scans can include scans for acquiring profile data indicating the sensitivity of each coil element (or each channel) in an array direction, scans for acquiring sensitivity maps indicating the sensitivity distribution of each coil element (or each channel), scans for acquiring spectrum data for obtaining a center frequency of the RF pulse, and scans for obtaining a current value that is caused to flow in a correction coil (not shown) in order to adjust the uniformity of the magnetostatic field. The sensitivity maps are generally acquired before the image generation process and generally do not need to be acquired prior to the imaging scan, discussed below.

Figure 3:
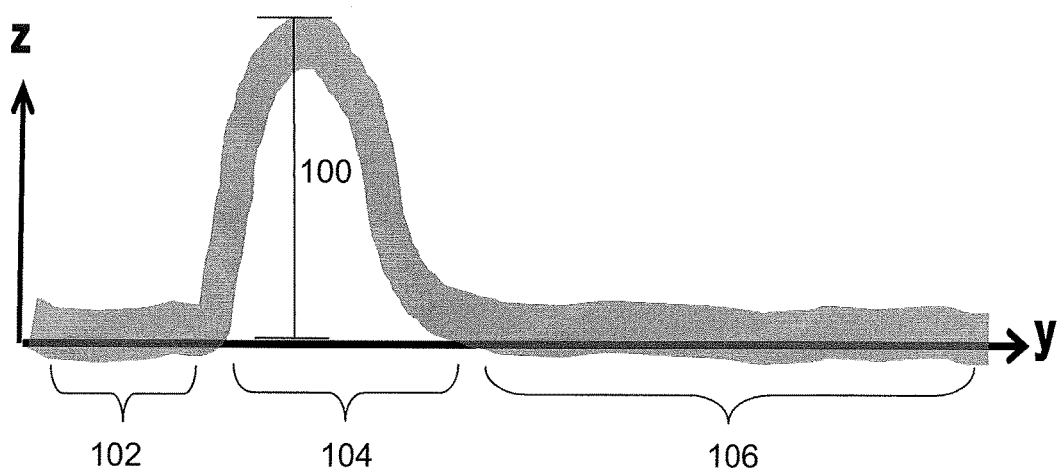
FIG. 3 is an exemplary image of signal data demonstrating distortion in the slice (z) direction.

Next, the MRI sequence controller 30 controls selection and application of a pulse sequence to acquire MR data of one section of the patient's body (S-104). For example, the MRI sequence controller 30 acquires the MR data using a Spin Echo (SE) pulse sequence. The portion of the patient's body the section is acquired in can be any suitable portion, including the legs, torso, arms and head. The acquired image data is received by MRI data processor 42, which samples the data to generate an image or set of images (S-105). An example of this image with distortion in the slice direction caused by metal is shown in FIG. 3.

Because in this embodiment the image contains one or more portions that are above the predetermined threshold distortion range in the slice direction the MR image acquisition proceeds to metal element correction scan (S-106).

The predetermined threshold range for distortion correction can be adjusted based on acceptable distortion levels for a particular scan of a patient. For example, if a low level of distortion is preferred in an MR image because information regarding the patient's body abutting a metal implant is desired, the predetermined range can be set to a large number. In contrast, if a greater amount of distortion is satisfactory, then the predetermined range can be adjusted to be less as compared to if little distortion is preferred.

In this embodiment the determination of whether one or more portions is beyond a predetermined range of the slice axis is made by MRI data processor 42, but in other embodiments this determination can be made by a user after viewing the image on display 24.

The one or more metal elements causing the distortion can be any portion of a metallic substance in or on a patient undergoing MR imaging. Non-exclusive examples of these metallic substances are staples and other surgical implements, dental elements such as crowns and fillings, fixation devices such as plates, screws and pins, artificial joints, including hip implants and artificial knees, and pacemakers and other implantable electrical devices, but the method is applicable to any portion of a metallic substance in or on a patient undergoing MR imaging.

Figure 4:
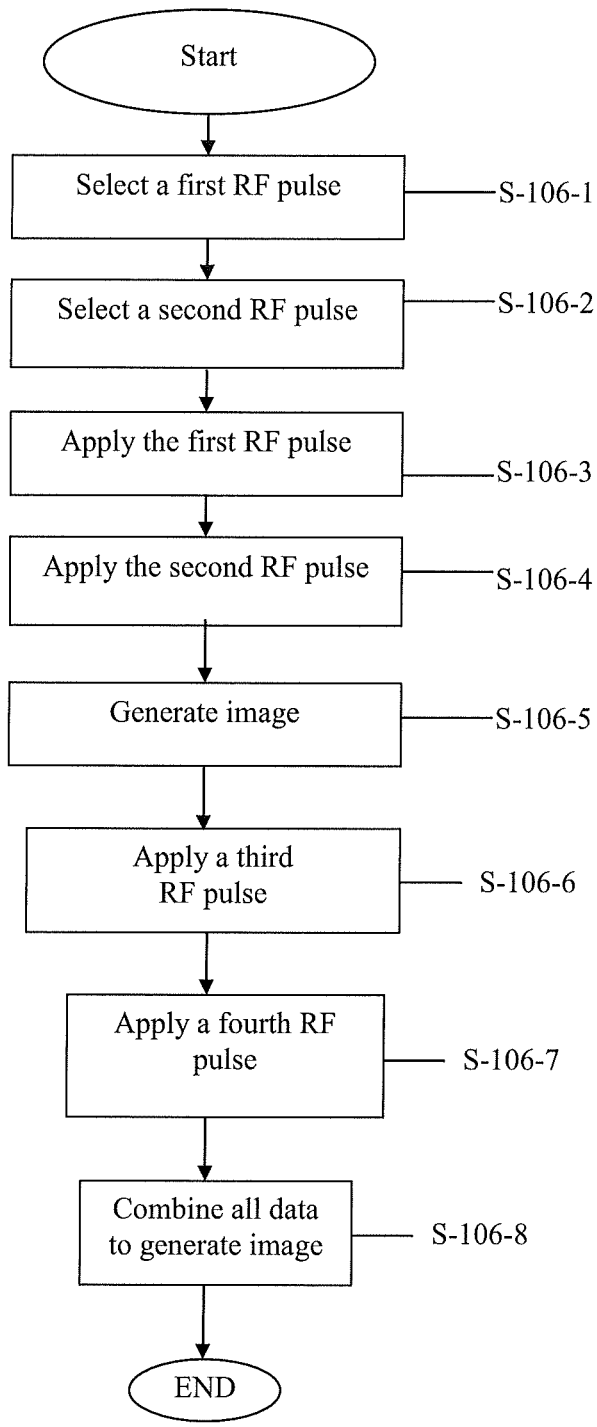
FIG. 4 is a flowchart of a metal element correction optionally completed in the flowchart in FIG. 2.

S-106 is further described in FIG. 4, which illustrates a flowchart of the application of metal element correction. When distortion is determined as being caused by one or more metal elements, the first step in metal element correction is to select a first RF pulse (S-106-1), which can be an excitation pulse, and then select a second RF pulse (S-106-2). The first RF pulse and the second RF pulse can be selected based on predetermined preset values or the first RF pulse and the second RF pulse can be selected based on desired image features such as section thickness.

Then, a first RF pulse is applied (S-106-3). This first RF pulse excites a section of the patient, which is the same section of the patient as the section acquired in S-104.

Then, a second RF pulse is applied (S-106-4) at a bandwidth ($BW_{refocus}$). The first RF pulse can be the same or different frequency than the second RF pulse. This second RF pulse forms at least one echo in the section of the patient. This second RF pulse can be any pulse that forms at least one full or partial echo. Examples of this second RF pulse include a refocus of 180°, but, in other embodiments, this second RF pulse can be used to form any suitable RF echo, such as a sub-180° spin echo, such as about a 120° angle, an about 140° angle, an about 160° angle, or the like if smaller spin echo signals are acceptable, or if a smaller thermal energy deposition is desired, as compared to a refocus pulse of 180°. This second RF pulse can also be any pulse that is capable of forming any spin echo, a stimulated echo or a Hahn echo.

This second RF pulse at least partially refocuses the spin magnetic moments excited by the first RF pulse in the section of the patient. Although in this embodiment, the second RF pulse is described as forming one echo, in other embodiments a train of RF pulses can form two or more echoes, such as in a fast spin echo (FSE).

One of the first RF pulse and the second RF pulse in steps S-106-3 and S-106-4 is spatially selective, with the other being non-spatially selective. The section of the patient that previously received a pulse sequence in S-104 again receives a pulse since the gradient in S-104 is the same as the gradient in one of steps S-106-3 or S-106-4.

Further, off resonant spin magnetic moments are not refocused by the second RF pulse in S-106-4. To ensure that the off resonant spin magnetic moments are not refocused, a suitable crusher gradient can be included.

Further, the second RF pulse in step S-106-4 is applied at an independent frequency, possibly different than the first RF pulse in step S-106-3, which forms a frequency difference between the two RF pulses. This frequency difference is divided by the spatially selective gradient to determine the position of the refocused section with the following formula, with the frequency difference between the first RF pulse and the second RF pulse being $\Delta f_n$, the position along the z axis being $z_n$, and the selection gradient being $G_{sS}$:

$$z_n = \Delta f_n / G_{ss}$$

When the first RF pulse is spatially selective, the section selection is made according to the following formulae, with the frequency offset of the first RF pulse being $f_1$, and the frequency offset of the second RF pulse being $f_2$, the selection gradient being $G_{ss}$, and the unknown background gradient (due to effects of susceptibility caused by the presence of metal) being x:

$$f_1 = G_{ss}z + x$$

$$f_2 = x$$

The applied gradient $G_{ss}$ and frequency offsets $f_1$ and $f_2$ are known. Then replacing the unknown x term in the first equation with $f_2$:

$$f_1 = G_{ss}z + f_2$$

$$z = \frac{f_1 - f_2}{G_{ss}}$$

$$z = \frac{\Delta f}{G_{ss}}$$

When the first RF pulse is non-spatially selective, the z selection is made according to the following formulae, with the frequency offset of the first RF pulse being $f_1$, and the frequency offset of the second RF pulse being $f_2$, the selection gradient being $G_{ss}$, and the unknown background gradient (due to effects of susceptibility caused by the presence of metal) being x:

$$f_1 = x$$

$$f_2 = G_{ss}z + x$$

Then replacing the x term in the first equation with $f_1$:

$$f_2 = G_{ss}z + f_1$$

$$z = \frac{f_2 - f_1}{G_{ss}}$$

$$z = \frac{\Delta f}{G_{ss}}$$

The thickness of the section of the patient is determined according to the following equation:

$$\Delta z = \frac{BW_{refocus}}{G_{ss}}$$

Figure 5A:
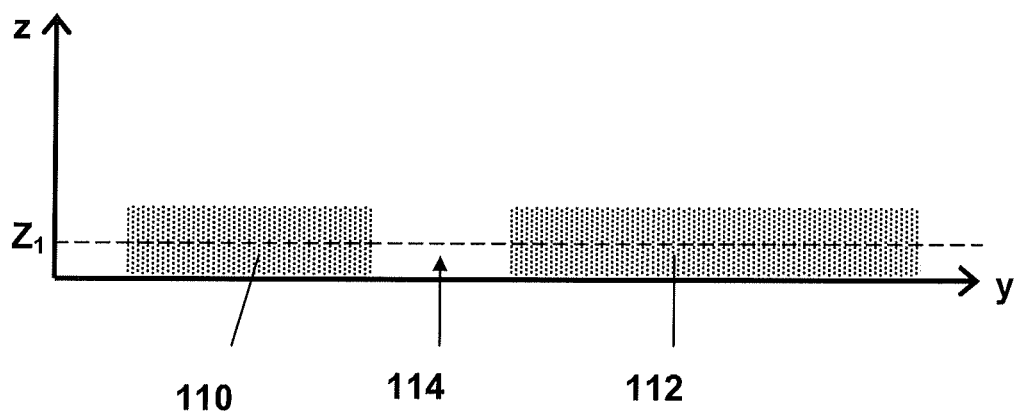
FIG. 5A is exemplary collected signal data of a portion of a patient.

Because the second RF pulse refocuses the spin magnetic moments excited by the first RF pulse in the section of the patient, at a controlled thickness ($\Delta z$), only a portion of the data is obtained from an image (for example the image shown in FIG. 3). Specifically, as shown in FIG. 5A, the collected signal data of the section is in the two rectangular regions, 110 and 112, based on the selected $z_1$ location, with the height of the two regions ($\Delta z$) being controlled by the $BW_{refocus}$ value and the slice selective gradient. Regions 110 and 112 represent the collected signal data near z=0 and do not include signal data from the distorted area shown as 104 in FIG. 3. Thus, region 114 does not include any signal data. Other signal data outside regions 110 and 112 are not collected and will not be resolved.

Referring back to FIG. 4, in the next step after application of second RF pulse, S-106-4, the signal data obtained from the first section is reconstructed in MRI data processor 42 to generate an image (S-106-5). In this embodiment, MRI data processor 42 determines that less than the predetermined threshold of image data has been collected. In this embodiment less than the predetermined threshold of image data was collected after application of the first RF pulse (S-106-3) and the second RF pulse (S-106-4), but in other embodiments, gathered image data can be at or above the predetermined threshold and no further pulses are applied to the section. For example, in an embodiment where gathered image data are at or above the predetermined threshold after application of a first RF pulse and a second RF pulse, the upper edge of regions 110 and 112 of FIG. 5A could indicate the predetermined threshold.

The threshold for whether sufficient signal data is collected can be a preset value depending on the need for signal data in the vicinity of the metal artifact. If the collected signal data are above a predetermined preset value or predetermined adjustable value, the metal element correction scan (S-106 of FIG. 2) is completed and the process proceeds to S-107 in FIG. 2. Because in this embodiment the collected signal data is below the predetermined threshold range, as determined by MRI data processor 42, a third RF pulse (S-106-6) is applied, which can be an excitation pulse, followed by application of a fourth RF pulse (S-106-7) to the same section of the patient as steps S-106-3 and S-106-4.

In this subsequent set of RF pulses (S-106-6 and S-106-7), whichever of the pulses is selective (either S-106-6 or S-106-7) is applied with, in this embodiment, the same frequency offset as in the initial pulse sequence in steps S-106-3 and S-106-4. The fourth RF pulse in S-106-7 uses a refocus bandwidth (second $BW_{refocus}$), which can be the same bandwidth as or a different bandwidth than the first $BW_{refocus}$. At least one of the third RF pulse and the fourth RF pulse has a different frequency than one or both of the first RF pulse and the second RF pulse.

This fourth RF pulse, like the second RF pulse, can be any pulse that forms at least one full or partial echo. Examples of this fourth RF pulse include a refocus of 180°, but, in other embodiments, this fourth RF pulse can be used to form any suitable RF echo, such as a sub-180° spin echo, such as about a 120° angle, an about 140° angle, an about 160° angle, or the like if smaller spin echo signals are acceptable, or if a smaller thermal energy deposition is desired, as compared to a refocus pulse of 180°. This fourth RF pulse can also be any pulse that is capable of forming any spin echo, a stimulated echo or a Hahn echo.

This second RF pulse set forms at least one echo in a second section of the patient. These steps, S-106-6 and S-106-7 are similar to S-106-3 and S-106-4, but occur at a different spatial location or portion, either overlapping with the first section or in a different location, that is determined by new frequencies of the RF pulse set. The third RF pulse can be the same as or different frequency than the fourth RF pulse.

One of the third RF pulse in S-106-6 and the fourth RF pulse in S-106-7 is spatially selective, with the other being non-spatially selective. The spatial location of the second section excited in S-106-6 and S-106-7 is controlled by the change in the frequency difference between the third RF pulse in S-106-6 and the fourth RF pulse in S-106-7 or alternatively with a change in the second $BW_{refocus}$. Each of these values can be selected by a user based on experience or a predetermined schedule, or they can be set automatically for every patient. The location of the second section can be resolved in the slice axis based on the change in frequency between the third RF pulse in S-106-6 and the fourth RF pulse in S-106-7 and the second $BW_{refocus}$.

Figure 5B:
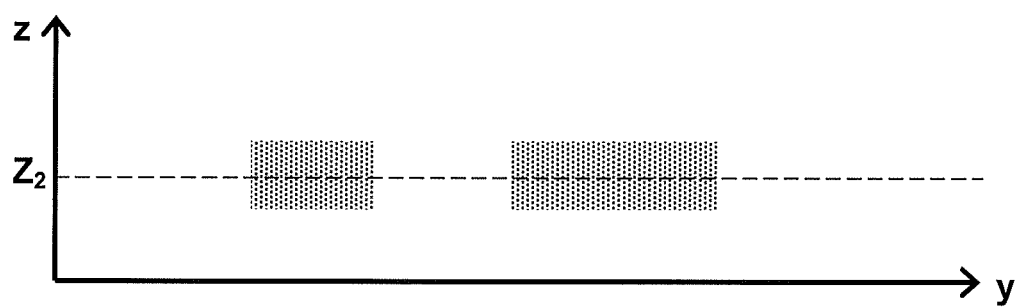
FIG. 5B is exemplary collected signal data of the portion of the patient.

The signal data results obtained by S-106-6 and S-106-7 are shown in FIG. 5B. In the example shown in FIG. 5B, the collected signal data of the section is in the two rectangular regions, based on the selected $z_2$ location, with the height of the two regions ($\Delta z$) being controlled by the second $BW_{refocus}$ and the slice selective gradient. In this embodiment this $\Delta z$ is the same as the $\Delta z$ shown in FIG. 5A, but in other embodiments, a different $\Delta z$ value can be used in steps S-106-6 and S-106-7 by modifying the second $BW_{refocus}$ to be different than the first $BW_{refocus}$.

In this example, the vertically lower border in FIG. 5B is the same as the vertically higher border in FIG. 5A, thus, in this example, no overlapping of sections occurs. But, in other embodiments, these sections can overlap or be separated by an area without data collection.

Figure 5C:
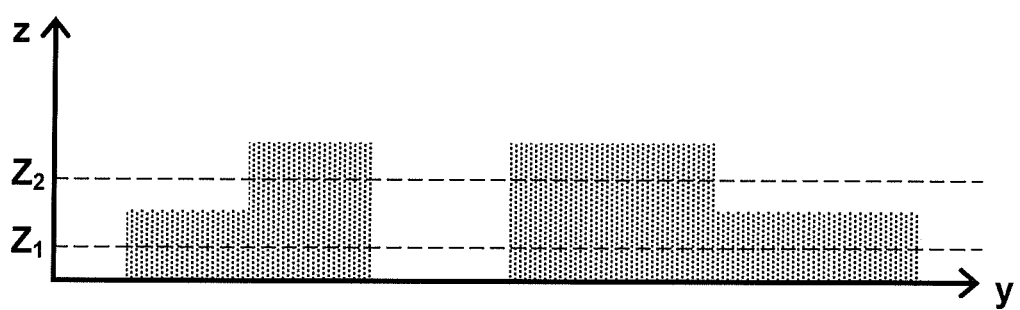
FIG. 5C is the exemplary compilation of the signal data of the portion of the patient.

Then, in the next step (S-106-8), the signal data obtained in the first section by steps S-106-3 and S-106-4 is compiled into a stack with the signal data obtained in the second section by steps S-106-6 and S-106-7 using any suitable method to compile a stack of sections into a three dimensional volume, as shown in FIG. 5C.

In this embodiment the full predetermined threshold range of data is collected by the two sets of RF pulses (S-106-3 and S-106-4 & S-106-6 and S-106-7) but in other embodiments the predetermined threshold range can be higher and further sets of RF pulses can be applied.

Next, the data processing unit 42 performs image reconstruction processing of the MR data and image processing to generate image data for displaying. The generated image data can be displayed on the display unit 24 in S-107. In addition, image data can also be stored in the MRI image memory 46.

Because sufficient signal data is collected in this embodiment, and a compiled image is formed by MRI data processor 42, the results of the imaged sections can be displayed on a display in S-107 and the MRI apparatus 100 can continue to image other locations of the patient's body as desired. The obtained image data over other locations of the patient's body can be combined with the metal element corrected area to provide an image over a desired location of a patient with reduced or no distortion in that image due to the metal element correction scan in step S-107.

In principle, specific processing orders exemplified in the embodiments described above are only examples. The specific steps can be rearranged and/or combined if desired. Further, specific pulse sequences can be changed based on various requirements such as desired scan time and desired image quality. These pulse sequences can be any suitable pulse sequence, including Spin Echo (SE) sequences, Fast Spin Echo (FSE) sequences, fast asymmetric spin echo sequences (FASE), Single Shot FSE sequences (SSFSE), or Half Fourier SSFSE sequences (HASTE) or Spin-echo based Echo Planar Images (SE-EPI), among others. Also, any of the generated images can be PD, T1 or T2 weighted based on desired image outcomes.

In some embodiments, the metal element correction can be combined with view angle tilting (VAT). VAT includes a gradient applied on the slice select axis during readout, with an amplitude equal to that of the slice select gradient. VAT pulse sequence uses a gradient on the slice select (for example, z) axis during readout that is equal in amplitude to the slice-select gradient, to eliminate or substantially eliminate in-plane distortion.

The slice is then effectively viewed at an angle of:

$$\theta = \text{Tan}^{-1} * G_z / G_x$$

This causes shifts in the slice-selection direction to cancel shifts in the readout direction. VAT is capable of registering all off-resonance spins in the image plane.

VAT can also be accomplished by providing the same slice-select gradient as the gradient provided during one of S-106-3 or S-106-4, during the readout. In this example of VAT, the frequency of all spins in the excited section will be kept within the RF excitation bandwidth, which is low enough to avoid in-plane distortion beyond the tilt of the voxels in the section.

Additionally, while FIG. 1 generally illustrates an example of a closed MRI system, the embodiments of the present disclosure are applicable in open MRI systems and table type MRI systems, based on the requirements of the image and the type of imaging being performed.

In the embodiments described above, an example in which the MRI apparatus 100, which is a medical diagnostic imaging apparatus, performs various processes has been explained however, the embodiments are not limited thereto. For example, an image processing system including the MRI apparatus 100 and an image processing apparatus can perform the various processes described above. The image processing apparatus is, for example, a workstation, an image storage apparatus (an image server) and a viewer in PACS (Picture Archiving and Communication System), and various apparatus in an electronic health record system.

In the above described embodiments, the MRI apparatus 100 performs acquisition by the MRI sequence control unit 30. Meanwhile, the MRI data processor 42 receives the MR data and k-space data acquired by the MRI apparatus 100 or from the image server via a network, or receives the MR data and k-space data input by an operator via a recording medium, and stores these pieces of data in the MRI image memory 46. Thereafter, the MRI data processor 42 can perform the various processes described above, for example, the application of metal element correction, with respect to the MR data and k-space data stored in the storage unit.

Process steps described in the above embodiments can be performed based on a program. A computer can be configured to store the program in advance and then read the program to as to achieve the effects as those achieved by MRI apparatus 100 of the embodiments discussed above. The instructions described in the embodiments above can be recorded in a magnetic disc (a flexible disc, a hard disc or hard drive, and the like), an optical disc (a CD-ROM, a CD-R, a CD-RW, a DVD-ROM, a DVD±R, a DVD±RW and the like), a semiconductor memory, or any suitable recording medium, as a program that can be executed by a computer.

As the computer reads the program from the recording medium and executes the instructions described in the program on a CPU, operation of the MRI apparatus 100 can be realized. Further, the computer can acquire or read the program through a network when the computer acquires or reads the program.

An operating system (OS) operated on a computer based on the instructions of a program installed in the computer or an embedded system from a storage medium, middleware (MW) such as database management software and a network, and the like can perform a part of respective processes for realizing the embodiments described above. Further, the storage medium is not limited to a medium independent of the computer or the embedded system, and includes the storage medium stored or temporarily stored by downloading a program transmitted through a local area network (LAN), the interne or any other suitable network. Also, the storage medium is not limited to one medium and when the processes in the embodiments described above are performed by a plurality of mediums.

The computer or embedded system in the embodiments above performs respective processes in the embodiments described above and can be of any configuration, such as a personal computer, a microcomputer, or a suitable processor, or a system in which a plurality of apparatus are connected by a network. The computer in the embodiments is not limited to a personal computer, can be an arithmetic processing unit incorporated in an information processor, a microcomputer or another suitable processor, with the computer representing one or more apparatus that can realize functions in the embodiments by a program.

While certain embodiments have been described, these embodiments have been presented by way of example only, and are not intended to limit the scope of the inventions. Indeed, the novel methods, apparatus and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A magnetic resonance imaging method for imaging a first region in a spatial inhomogeneity of a magnetic susceptibility within an imaged volume induces a deformation of a static magnetic field applied to the imaged volume, the method comprising:
   exciting two or more groups of echo signals corresponding to two or more layers of the first region using two or more RF frequency offsets, which correspond respectively to the two or more layers, the exciting of each of the echo signals being performed by
      executing a pulse sequence including an excitation radio frequency (RF) pulse, and one or more refocusing RF pulses having a center frequency that differs from a center frequency of the excitation RF pulse by an RF frequency offset of the RF frequency offsets, which corresponds to a layer of the two or more layers, wherein
   one of the excitation RF pulse and the one or more refocusing RF pulses is selected to be spatially selective with the other being selected to be non-spatially selective, and a gradient magnetic field is not applied to the first region during the one of the excitation RF pulse and the one or more refocusing RF pulses selected to be non-spatially selective;
   detecting, for each of the two or more layers, a group echo signals excited using one of the two or more RF frequency offsets, and associating the group echo signals with a layer of the two or more layers corresponding to the one of the two or more RF frequency offsets; and
   reconstructing, using the echo signals corresponding to the two or more layers of the first region, an image of the first region.

2. The method according to claim 1, wherein, the exciting of the echo signals is further performed such that:
   when the excitation RF pulse is selected to be spatially selective, (i) the gradient magnetic field is applied during the excitation RF pulse, (ii) the center frequency of the excitation RF pulse is set to a predetermined frequency, and (iii) the center frequency of the one or more refocusing RF pulses is set to differ from the center frequency of the excitation RF pulse by the RF frequency offset corresponding to the layer, and
   when the one or more refocusing RF pulses is selected to be spatially selective, (i) the gradient magnetic field is applied during the excitation RF pulse, (ii) the center frequency of the one or more refocusing RF pulses is set to the predetermined frequency, and (iii) the center frequency of the excitation RF pulse is set to differ from the center frequency of the one or more refocusing RF pulses by the RF frequency offset corresponding to the layer.

3. The method according to claim 1, wherein
   the one of the excitation RF pulse and the one or more refocusing RF pulses selected to be the non-spatially selective RF pulse excite or refocus spins within all of the imaged volume, and
   the spatially selective RF pulse excite or refocus spins only within one of the two or more layers of the imaged volume.

4. The method according to claim 1, wherein the exciting of the groups of echo signals includes that each of the two or more layers has a spatial thickness determined by a ratio between a bandwidth of the spatially selective RF pulse and a magnitude in the first region of a gradient of the gradient magnetic field.

5. The method according to claim 1, wherein the method comprises correcting distortion of the image in a slice direction.

6. The method according to claim 5, wherein the method further comprises correcting distortion of the image in a readout direction.

7. The method according to claim 1, wherein the method comprises applying view angle tilting.

8. A magnetic resonance imaging apparatus for imaging a first region in a spatial inhomogeneity of a magnetic susceptibility within an imaged volume induces a deformation of a static magnetic field applied to the imaged volume, the apparatus comprising:
   processing circuitry configured to
      control an excitation of two or more groups of echo signals corresponding to two or more layers of the first region using two or more RF frequency offsets, which correspond respectively to the two or more layers, the exciting of each of the echo signals being performed by
         executing a pulse sequence including an excitation radio frequency (RF) pulse, and one or more refocusing RF pulses having a center frequency that differs from a center frequency of the excitation RF pulse by an RF frequency offset of the RF frequency offsets, which corresponds to a layer of the two or more layers, wherein
      one of the excitation RF pulse and the one or more refocusing RF pulses is selected to be spatially selective with the other being selected to be non-spatially selective, and a gradient magnetic field is not applied to the first region during the one of the excitation RF pulse and the one or more refocusing RF pulses selected to be non-spatially selective;

receiving, for each of the two or more layers, a group of detected echo signals excited using one of the two or more RF frequency offsets, and associating the group echo signals with a layer of the two or more layers corresponding to the one of the two or more RF frequency offsets, and reconstructing, using the echo signals corresponding to the two or more layers of the first region, an image of the first region.

9. A magnetic resonance imaging system for imaging a first region in a spatial inhomogeneity of a magnetic susceptibility within an imaged volume induces a deformation of a static magnetic field applied to the imaged volume, the apparatus comprising:

gantry including gradient coils and a radio-frequency (RF) transmitter and receiver, configured to excite two or more groups of echo signals corresponding to two or more layers of the first region using two or more RF frequency offsets, which correspond respectively to the two or more layers, the exciting of each of the echo signals being performed by executing a pulse sequence including an excitation radio frequency (RF) pulse, and one or more refocusing RF pulses having a center frequency that differs from a center frequency of the excitation RF pulse by an RF frequency offset of the RF frequency offsets, which corresponds to a layer of the two or more layers, wherein one of the excitation RF pulse and the one or more refocusing RF pulses is selected to be spatially selective with the other being selected to be non-spatially selective, and a gradient magnetic field is not applied to the first region during the one of the excitation RF pulse and the one or more refocusing RF pulses selected to be non-spatially selective, and detect, for each of the two or more layers, a group echo signals excited using one of the two or more RF frequency offsets, and associating the group echo signals with a layer of the two or more layers corresponding to the one of the two or more RF frequency offsets; and processing circuitry configured to reconstruct, using the echo signals corresponding to the two or more layers of the first region, an image of the first region.

* * * * *